(12) United States Patent
Fishkin et al.

(10) Patent No.: US 6,202,658 B1
(45) Date of Patent: Mar. 20, 2001

(54) METHOD AND APPARATUS FOR CLEANING THE EDGE OF A THIN DISC

(75) Inventors: Boris Fishkin, San Carlos; Jianshe Tang, Cupertino; Brian J. Brown, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/191,061

(22) Filed: Nov. 11, 1998

(51) Int. Cl.$^7$ ........................................................ B08B 3/10
(52) U.S. Cl. .......................... 134/147; 134/153; 134/198; 134/184; 134/902
(58) Field of Search .................................... 134/138, 141, 134/198, 184, 147, 153, 902; 239/102.2

(56) References Cited

U.S. PATENT DOCUMENTS

| | | |
|---|---|---|
| 4,027,686 | 6/1977 | Shortes et al. . |
| 4,968,375 * | 11/1990 | Sato et al. ............................ 134/198 |
| 5,100,476 * | 3/1992 | Mase et al. . |
| 5,349,978 * | 9/1994 | Sago et al. ............................ 134/902 |
| 5,368,054 | 11/1994 | Koretsky et al. . |
| 5,383,483 * | 1/1995 | Shibano . |
| 5,485,644 * | 1/1996 | Shinbara et al. . |
| 5,526,835 * | 6/1996 | Olechow ............................... 134/138 |
| 5,540,245 | 7/1996 | Munakata et al. . |
| 5,675,856 | 10/1997 | Itzkowitz . |
| 5,698,040 | 12/1997 | Guldi et al. . |
| 5,725,414 | 3/1998 | Mainpour et al. . |
| 5,729,856 | 3/1998 | Jang et al. . |
| 5,803,970 * | 9/1998 | Tateyama et al. . |
| 5,858,112 * | 1/1999 | Yonemizu et al. . |
| 5,860,138 | 9/1998 | Kawasaki . |
| 5,861,066 | 1/1999 | Moinpour et al. . |
| 5,975,098 * | 11/1999 | Yoshitani et al. .................... 134/902 |
| 6,001,219 | 12/1999 | Caspar . |
| 6,003,527 * | 12/1999 | Netsu et al. . |
| 6,019,843 * | 2/2000 | Park et al. ............................ 134/902 |
| 6,021,789 * | 2/2000 | Akatsu ................................. 134/902 |
| 6,059,893 | 5/2000 | Kawasaki . |

FOREIGN PATENT DOCUMENTS

| | | |
|---|---|---|
| 63-266831 | 11/1988 | (JP) . |
| 2-90523 * | 3/1990 | (JP) ..................................... 134/902 |
| 22-72738 * | 11/1990 | (JP) ..................................... 134/902 |
| 42-13827 * | 8/1992 | (JP) ..................................... 134/902 |
| 5-175184 | 7/1993 | (JP) . |
| 51-75184 * | 7/1993 | (JP) ..................................... 134/902 |
| 11238713 | 8/1999 | (JP) . |

* cited by examiner

Primary Examiner—Frankie L. Stinson
(74) Attorney, Agent, or Firm—Dugan & Dugan

(57) ABSTRACT

An inventive edge cleaning device is provided for cleaning the edge a thin disc such as a semiconductor wafer. The inventive edge cleaning device has a sonic nozzle positioned so as to direct a liquid jet at the edge surface of the thin disc. Preferably the sonic nozzle is radially spaced from the thin disc's edge so that scrubbing, spin rinsing or spin cleaning may be simultaneously performed on the major surfaces of the thin disc as the thin disc edge is cleaned by the sonic nozzle. The liquid jet may include de-ionized water, $NH_4OH$, KOH, TMAH, HF, citric acid, a surfactant, or other similar cleaning solutions, and the nozzle may remain stationary as the thin disc rotates or the nozzle may scan the circumference of the thin disc to clean the entire edge of the thin disc.

16 Claims, 8 Drawing Sheets

METHOD AND APPARATUS FOR CLEANING THE EDGE OF A THIN DISC

FIELD OF THE INVENTION

The present invention relates generally to apparatuses and methods for cleaning thin discs, such as semiconductor wafers, compact discs, glass substrates and the like. More particularly, the invention relates to cleaning the edges of a thin disc.

BACKGROUND OF THE INVENTION

To manufacture a thin disc such as a semiconductor wafer, an elongated billet of semiconductor material is cut into very thin slices, about ¾ mm in thickness. The slices or wafers of semiconductor material are then lapped and polished by a process that applies an abrasive slurry to the semiconductor wafer's surfaces. A similar polishing step is performed to planarize dielectric or metal films during subsequent device processing on the semiconductor wafer.

After polishing, be it during wafer or device processing, slurry residue conventionally is cleaned from wafer surfaces via submersion in a tank of sonically energized cleaning fluid, via spraying with sonically energized cleaning or rinsing fluid, or via a scrubbing device which employs polyvinyl acetate (PVA) brushes, brushes made from other porous or sponge-like material, or brushes made from nylon bristles or similar materials. Although these conventional cleaning devices remove a substantial portion of the slurry residue which adheres to wafer edges, slurry particles nonetheless remain and produce defects during subsequent processing.

A conventional PVA brush scrubber disclosed in U.S. Pat. No. 5,675,856 is shown in the side elevational view of FIG. 1. The conventional scrubber 11, own in FIG. 1, comprises a pair of PVA brushes 13a, 13b. Each brush comprises a plurality of raised nodules 15 across the surface thereof, and a plurality of valleys 17 located among the nodules 15. The scrubber 11 also comprises a platform 19 for supporting a wafer W and a mechanism (not shown) for rotating the pair of PVA brushes 13a, 13b. The platform 19 comprises a plurality of spinning mechanisms 19a–c for spinning the wafer W. During scrubbing a fluid supply mechanism F, such as a plurality of spray nozzles, supplies fluid to both major surfaces of the wafer, flushing dislodged particles and cleaning residue from the major surface of the wafer and rinsing brushes.

Preferably, the pair of PVA brushes 13a, 13b are positioned to extend beyond the edge of the wafer W, so as to facilitate cleaning the wafer's edges. However, research shows that slurry induced defects still occur, and are caused by slurry residue remaining along the edges of the wafer despite cleaning with apparatuses such as that described above. Specifically, subsequent processing has been found to redistribute slurry residue from the wafer edges to the front of the wafer, causing defects. The same is believed to be true of all major surface cleaners, and scrubbers.

For instance, another conventional technique for cleaning slurry residue and other particles from the surfaces of a semiconductor wafer employs sonic nozzles that direct jets of liquid toward a major surface of a semiconductor wafer. FIG. 2 is a side elevational view of an exemplary sonic nozzle cleaning device 23 that includes a sonic nozzle 25 having an input port 25a, an output port 25b, and a vibrator 27 coupled to a generator 29 that drives the vibrator 27.

In operation, a cleaning solution (e.g., de-ionized water or another similar cleaning solution such as $NH_4OH$, KOH, TMAH, HF, citric acid or a surfactant) is supplied under pressure (e.g., 15 p.s.i.) to the input port 25a of the nozzle 25. The cleaning solution travels through the nozzle 25, passes under the vibrator 27 and travels through the output port 25b. As the cleaning solution leaves the output port 25b it strikes the major surface of an object to be cleaned (e.g., a major surface 31a of a semiconductor wafer 31).

The vibrator 27 vibrates at a sonic rate (e.g., ultrasonic at a frequency in the hundreds of kHz or megasonic at a frequency in the thousands of kHz) set by the generator 29. As the cleaning solution travels under the vibrator 27, the vibrator 27 induces longitudinal pressure waves 33 in the cleaning solution. The longitudinal pressure waves 33 travel to, strike and impart energy to the major surface 31a of the semiconductor wafer 31 approximately every 0.1 to 10 microseconds, depending on the particular frequency of the generator 29, thereby removing slurry residue and other particles from the major surface 31a of the wafer 31. The entire major surface 31a of the wafer 31 is cleaned by scanning the nozzle 25 across the wafer 31 while rotating the wafer 31 with a rotating mechanism 34. Slurry residue and other particles on the edges of the wafer 31, however, are not effectively cleaned by the jets of cleaning solution employed by this type of cleaning apparatus.

A number of devices have been developed to improve wafer edge cleaning. One such device is shown in the side elevational view of FIG. 3. This mechanism employs a separate edge brush 21, which is driven by a separate motor (not shown), that causes the edge brush 21 to rotate. The edge brush 21 fits over the edge of the wafer W as shown in FIG. 3, providing more effective wafer edge cleaning. Although the edge brush 21 addresses the need to clean slurry residue from wafer edges, it does so at the expense of increased scrubber complexity and cost, and the requirement of frequent edge brush replacement because of excessive mechanical wear.

Accordingly the field of wafer cleaning requires a method and apparatus which effectively cleans both the major surfaces and the edge surfaces of a semiconductor wafer, and that does so without increased cost and complexity. In short, the semiconductor processing field needs an effective edge cleaner that satisfies the ever-present demand for reduced cost per unit wafer processed.

SUMMARY OF THE INVENTION

The present invention addresses the need for an effective edge cleaner by providing a dedicated sonic nozzle specifically positioned to clean the edge surface of a thin disc such as a semiconductor wafer. A sonic nozzle (e.g., ultrasonic, megasonic, etc.) that produces a jet of liquid (e.g., de-ionized water, $NH_4OH$, KOH, TMAH, HF, citric acid or a surfactant) is positioned so that the liquid jet strikes an edge of the thin disc to be cleaned (i.e., an edge nozzle). The sonic nozzle preferably is radially spaced from the edge of the thin disc and the liquid jet preferably is directed approximately 30° to 150° from a tangent to the edge of the thin disc and approximately 135° to 225° from a major surface of the thin disc (see FIGS. 4A–C). In this position the liquid jet impacts the edge of the thin disc, and any beveled portions thereof, with the greatest energy. Moreover the time the thin disc's edge is exposed to sonic energy (i.e., the edge cleaning duty cycle) is significantly increased, providing superior edge cleaning. When employed with a conventional major surface cleaner, rinser or scrubber (i.e., a major surface cleaning mechanism) the invention's edge nozzle may replace the fluid supply mechanisms conventionally required to rinse particles from a thin disc's major surfaces, and/or to prevent thin discs such as semiconductor wafers from drying during cleaning (as drying may leave undesirable streaks and/or particles on wafer surfaces). Thus, in its preferred embodiment, the present invention cleans thin disc edges with minimal additional parts and with minimal additional cleaning fluid. Moreover, the inventive edge nozzle lasts longer than mechanical edge scrubbers, thereby reducing or eliminating replacement and maintenance costs.

To clean the entire circumference of the thin disc, the thin disc is scanned relative to the inventive edge nozzle. That is, either the thin disc is rotated while the inventive edge nozzle remains stationary, the inventive edge nozzle is scanned around the edge of the thin disc as the thin disc remains stationary, or a combination thereof.

Because the inventive edge nozzle is dedicated to edge cleaning, the nozzle may be radially spaced from the thin disc being cleaned, and therefore may be positioned so as not to obstruct or to be obstructed by a conventional major surface cleaner simultaneously employed therewith. The inventive edge nozzle thereby facilitates simultaneous use of a conventional major surface cleaner such as a brush scrubber, spin rinser (i.e., a non-scrubbing-based major surface cleaner that employs de-ionized water only), spin cleaner (i.e., a non-scrubbing-based major surface cleaner that employs a cleaning liquid such as de-ionized water and a surfactant) and even megasonic tank cleaners which clean wafers by rotating a wafer which is partially submerged in a tank of megasonically energized cleaning fluid. However, the inventive edge nozzle also may be used to clean the edge of the thin disc before or after the major surface of the thin disc has been cleaned.

Other objects, features and advantages of the present invention will become more fully apparent from the following detailed description of the preferred embodiments, the appended claims and the accompanying drawings.

BRIEF DESCRIPTION OF THE PREFERRED EMBODIMENTS

DETAILED DESCRIPTION OF THE PREFERRED EMBODIMENTS

Figure 4A:
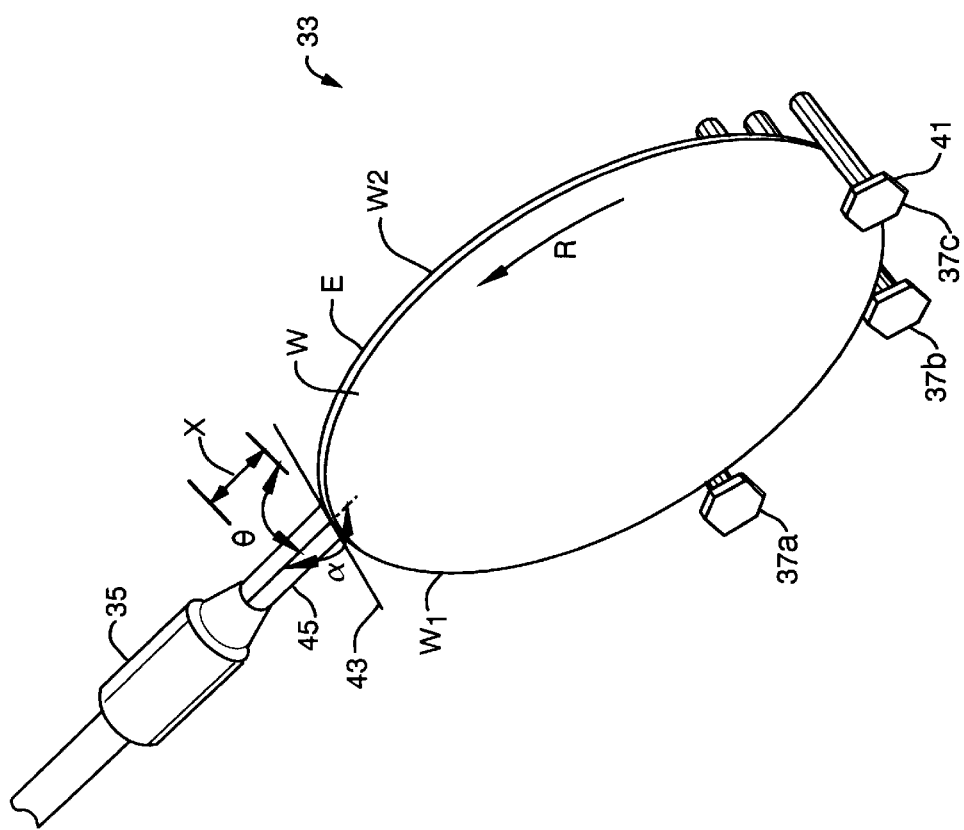
FIG. 4A is a schematic side elevational view of the inventive edge nozzle during wafer edge cleaning.

FIG. 4A is a side elevational view of an inventive thin disc edge cleaner 33. The edge cleaner 33 comprises an inventive edge nozzle 35 radially spaced from an edge of a thin disc to be cleaned (e.g., an edge E (FIG. 4C) of a wafer W), and a plurality of rotating wheels 37$a$–$c$ that support the wafer W via grooves such as groove 41 shown in the wheel 37$c$. Each groove 41 has a sidewall angle (e.g., of 45°) so that only the very edge of the wafer W contacts the rotating wheels 37$a$–$c$.

Figure 4B:
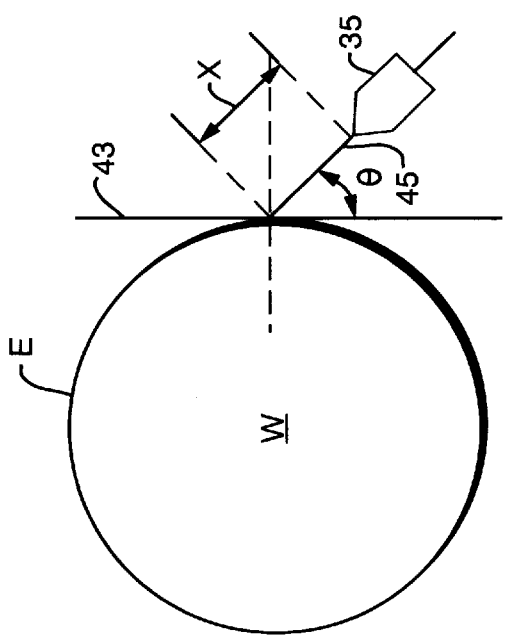
FIGS. 4B and 4C are a top and a side elevational view, respectively, of the inventive edge nozzle positioned relative to a wafer.
Figure 4C:
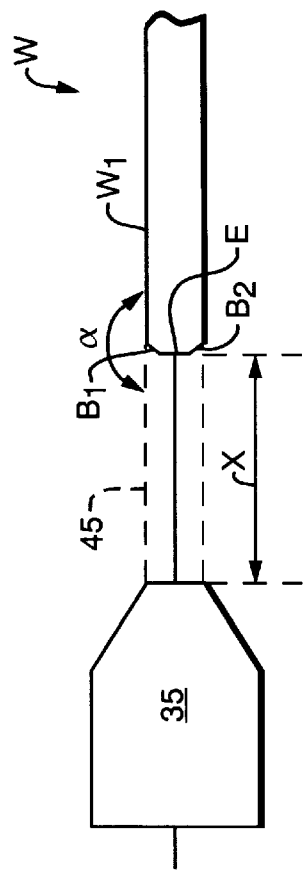

The sonic edge nozzle 35 is radially spaced a distance x from the wafer W and emits a liquid jet 45 at an angle θ from a tangent 43 to the wafer W, and at an angle α from either major surface $W_1$ or $W_2$ of the wafer W whereby the liquid jet 45 strikes the edge E of the wafer W (rather than either major surface $W_1$ or $W_2$). FIGS. 4B and 4C are top and side views, respectively, of the edge nozzle 35 positioned relative to the wafer W. Specifically, FIGS. 4B and 4C show the distance x as measured from the edge E of the wafer W, the angle θ as measured from the tangent 43 to the wafer W and the angle α as measured from the major surface $W_1$ of the wafer W. Also shown in FIG. 4C are a first bevel $B_1$ and a second bevel B2 on the edge E of the wafer W.

With reference to FIG. 4C, to maximize edge cleaning and to ensure that the liquid jet 45 cleans both beveled surfaces B1 and B2 of the wafer W, the angle α preferably is selected such that the center of the liquid jet 45, the portion of the jet that has the highest sonic power density, strikes the center of the edge E. However, the angle α may be selected to enhance cleaning of either beveled surface $B_1$ or $B_2$. Additionally, the distance x preferably is selected to allow edge cleaning via the inventive edge nozzle 35 simultaneously with the cleaning of major surface $W_1$ and/or major surface $W_2$ via a conventional brush scrubber, spin rinser, spin cleaner or any other similar cleaning mechanism which leaves the edge region of the wafer exposed so that spray from the inventive edge nozzle 35 may contact the wafer's edge, as described below.

In operation, a cleaning solution such as de-ionized water, $NH_4OH$, KOH, TMAH, HF, citric acid, a surfactant, etc., is supplied under pressure to the inventive edge nozzle 35. As the cleaning solution travels through the nozzle 35, the cleaning solution travels under a vibrator (not shown) and leaves the nozzle 35, forming the liquid jet 45. Thereafter, because of the positioning of the inventive edge nozzle 35, the liquid jet 45 strikes the edge E of the wafer W.

As previously described, the vibrator (not shown) of the inventive edge nozzle 35 vibrates at a sonic rate, preferably megasonic, so as to induce longitudinal pressure waves in the liquid jet 45. The longitudinal pressure waves travel to, strike and impart energy to the edge E of the wafer W approximately every 0.1 to 1 microseconds, depending on the particular frequency at which the vibrator vibrates. The longitudinal pressure waves also strike, impart energy to, and thereby remove slurry residue and other particles from the edge E of the wafer W. Because the liquid jet 45 is directed at the edge E of the wafer W, it effectively removes slurry residue and other particles from the edge E of the wafer W. To maximize the cleaning power of the inventive edge nozzle 35, the edge nozzle 35 is preferably positioned such that the distance x is in the range of 1 to 50 mm, θ is in the range of 30° to 150°, or, more preferably 45° to 135°, and α is in the range of 135° to 225°, or, more preferably 150° to 210°, or, more preferably 170° to 190°. Most preferably θ is 45° and α is 180°, and the distance x is selected to optimize transmitted power from the liquid jet 45 to the wafer edge E based on the specific sonic frequency and flow rate of the liquid jet 45, as will be apparent to those of ordinary skill in the art. For conventional sonic frequencies and flow rates a distance x in the range of 7 to 20 mm is preferred.

Figure 7:
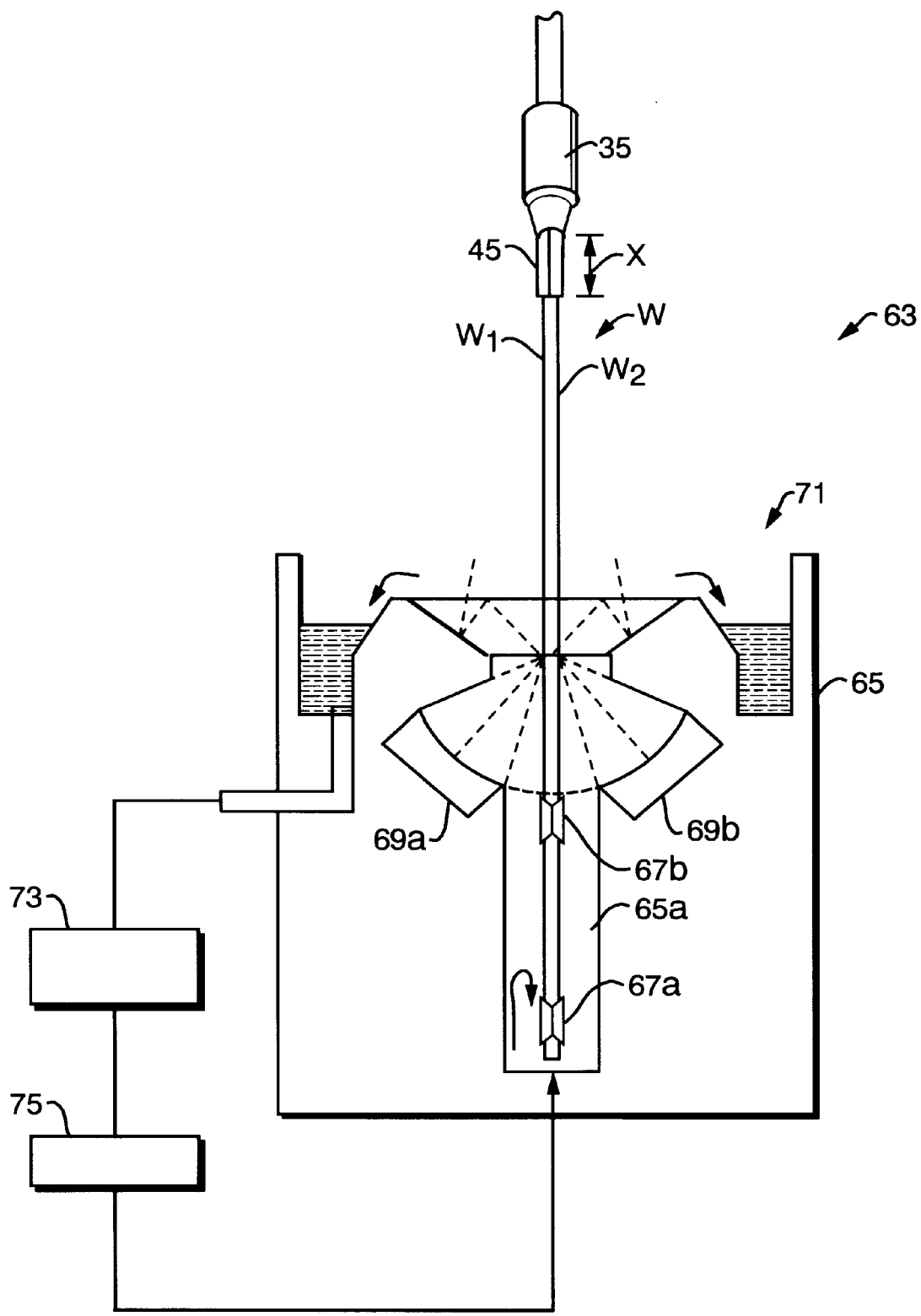
FIG. 7 is a side elevational view of a megasonic tank cleaner employing the inventive edge nozzle.

As the liquid jet 45 strikes the edge E of the wafer W, the wafer W is rotated by the rotating wheels 37$a$–$c$. Any conventional rotating mechanisms such as an electric motor may be used to rotate the wheels 37a–c. After one complete rotation of the wafer W, the entire circumference of the wafer W is cleaned. The nozzle 35, alternatively, may be scanned about the wafer W as the wafer W is either rotated or held stationary. The liquid jet 45 emitted by the inventive edge nozzle 35 may be used to prevent the wafer W from drying, particularly when the nozzle 35 is positioned along the elevated region of a vertically oriented wafer, as shown in FIG. 7.

Figure 5:
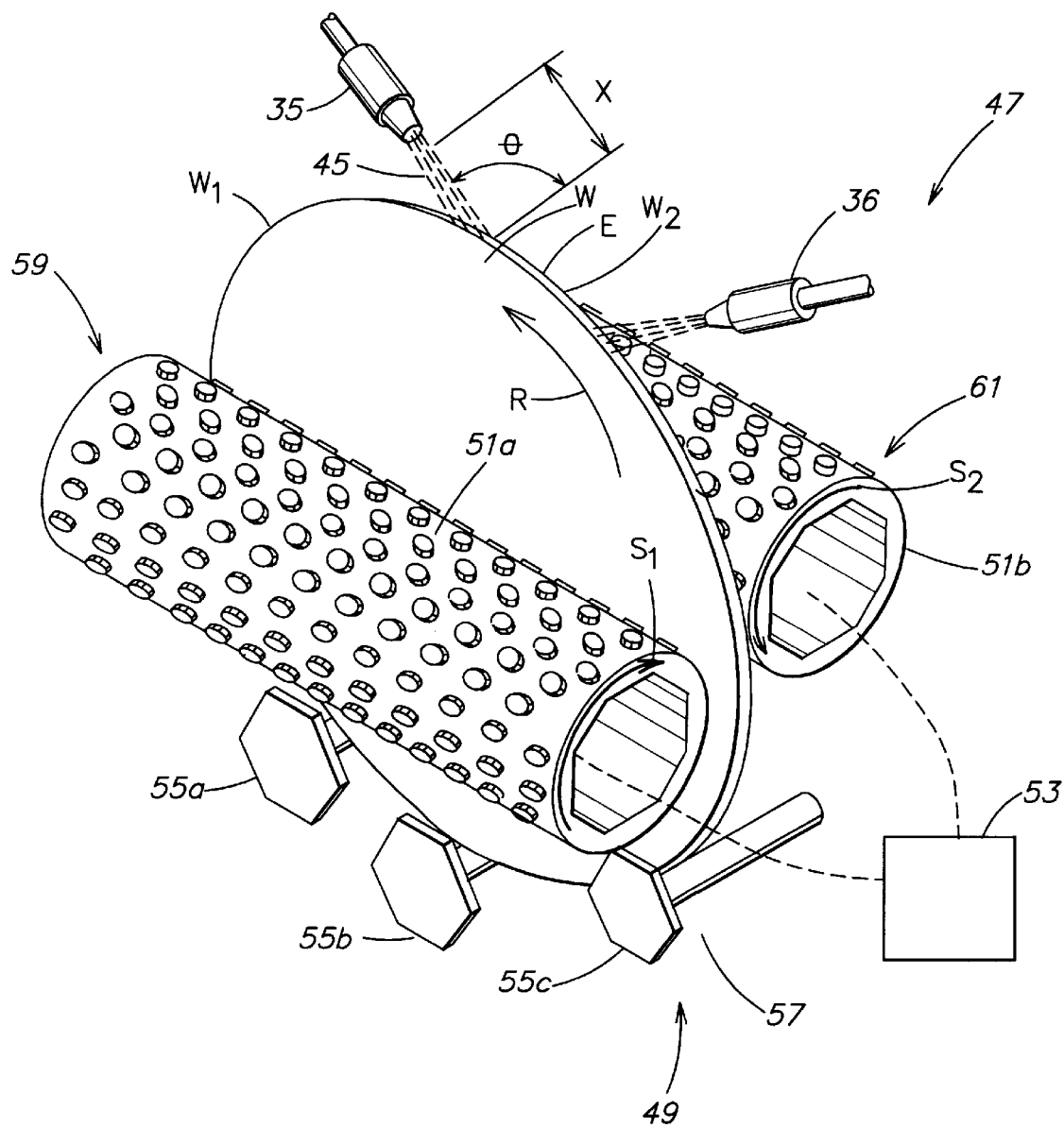
FIG. 5 is a schematic side elevational view of the inventive edge nozzle during simultaneous wafer edge and wafer major surface cleaning.

FIG. 5 is a side perspective view of a scrubbing device 47 that employs the inventive edge cleaning device 33 of FIG. 4A, and is useful in describing the advantages provided by the present invention. As shown in FIG. 5, the inventive scrubbing device 47 comprises a platform 49 for supporting a wafer W to be cleaned. A first brush 51a and a second brush 51b are operatively coupled to the platform 49 so as to contact both the major surfaces $W_1$ and $W_2$ of the wafer W, respectively.

A conventional spinning mechanism such as a motor, represented generally by reference number 53, is operatively coupled to the first and second brushes 51a, 51b so as to selectively spin the first and second brushes 51a, 51b as described below. Further, a rotating mechanism is operatively coupled to the platform 49 so as to rotate the wafer W positioned thereon. Preferably, as shown in FIG. 5, the platform 49 comprises a plurality of rotating wheels 55a–c, similar to the rotating wheels 37a–c of FIG. 4A, for both supporting and rotating the wafer W. Specifically, each rotating wheel 55a–c has a central notch or groove 57, having a sidewall angle (e.g., of 45°) such that only the very edge of the wafer W contacts the rotating wheels 55a–c. The notches thus prevent damage to the front or back wafer surfaces which may otherwise occur.

In operation, the first and second brushes 51a, 51b are initially in an open position (not shown), a sufficient distance from each other so as to allow a wafer to be inserted therebetween. Thereafter, the wafer W to be cleaned is positioned between the first and second brushes 51a, 51b and the brushes assume a closed position (FIG. 5), sufficiently close to each other so as to both hold the wafer W in place therebetween and to exert a force on the wafer surfaces sufficient to achieve effective cleaning. Mechanisms (not shown) for moving the brushes 51a, 51b between the open and closed positions are well known in the art and are therefore not further described herein.

Once the brushes 51a, 51b are in the closed position, the spinning mechanism 53 is engaged and the first and second brushes 51a, 51b begin to spin. Preferably the brushes 51a, 51b spin in opposite directions, as indicated by arrows S1 and S2 in FIG. 5, applying forces to the wafer W in a first direction (e.g., downward) while the wafer W rotates either clockwise or counterclockwise. This drives the wafer into the rotating wheels 55a–c, so that the wafer W remains captured thereby.

The nodules 59, 61 of the first and second brushes 51a, 51b, respectively, contact the major surfaces $W_1$ and $W_2$ of the wafer W, cleaning slurry residue therefrom. Preferably while the first and second brushes 51a, 51b scrub the major surfaces of the wafer, the inventive edge nozzle 35 sprays the liquid jet 45 at the edge E of the wafer W, effectively cleaning slurry residue from the edge E, as previously described with reference to FIG. 4A.

While the pair of brushes 51a, 51b spin, the rotating wheels 55a–c which engage the wafer's edge E rotate, causing the wafer W to rotate. Rotation of the wafer W ensures that the pair of brushes 51a, 51b contact each point along the major surfaces of the wafer W, and that the liquid jet 45 contacts each point along the circumference of the wafer W. Because the inventive edge nozzle is dedicated to cleaning the edge E of the wafer W, the edge E and the major surfaces $W_1$ and $W_2$ are simultaneously cleaned without requiring any additional time compared to the time required to clean only the major surfaces $W_1$ and $W_2$.

Positioning the inventive edge nozzle 35 so as to direct the liquid jet 45 at the edge E of wafer W allows the edge E of wafer W to be cleaned more effectively and more economically than with conventional edge brushes which require both additional motors to scrub the wafer's edge, and additional fluids both to rinse particles from the edge brush and to provide the necessary chemistry for cleaning. Further, unlike a brush type edge cleaner, the inventive nozzle will not readily wear, and will not require frequent replacement.

Figure 1:
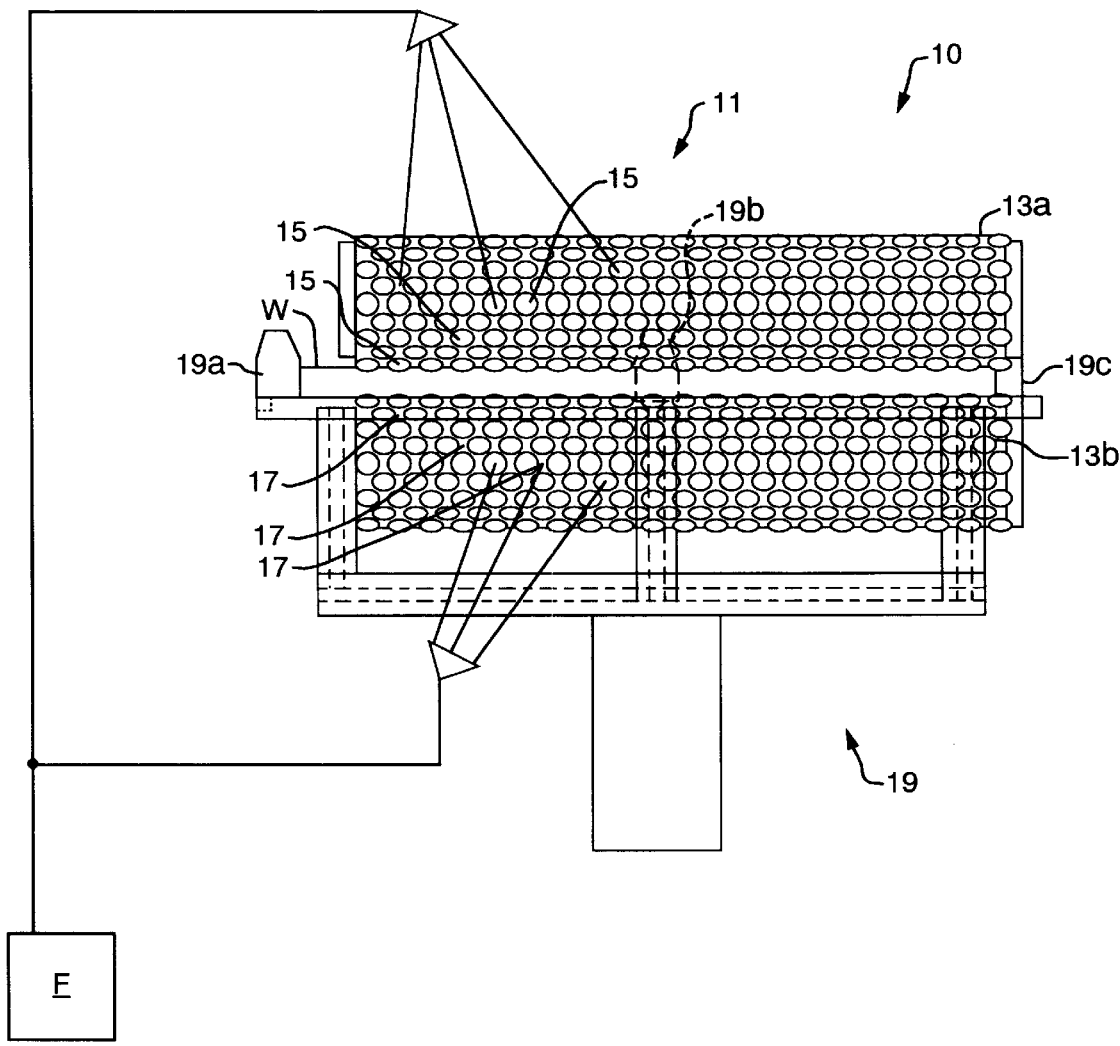
FIG. 1 is a schematic side elevational view of a conventional wafer scrubbing device, as previously described.
Figure 2:
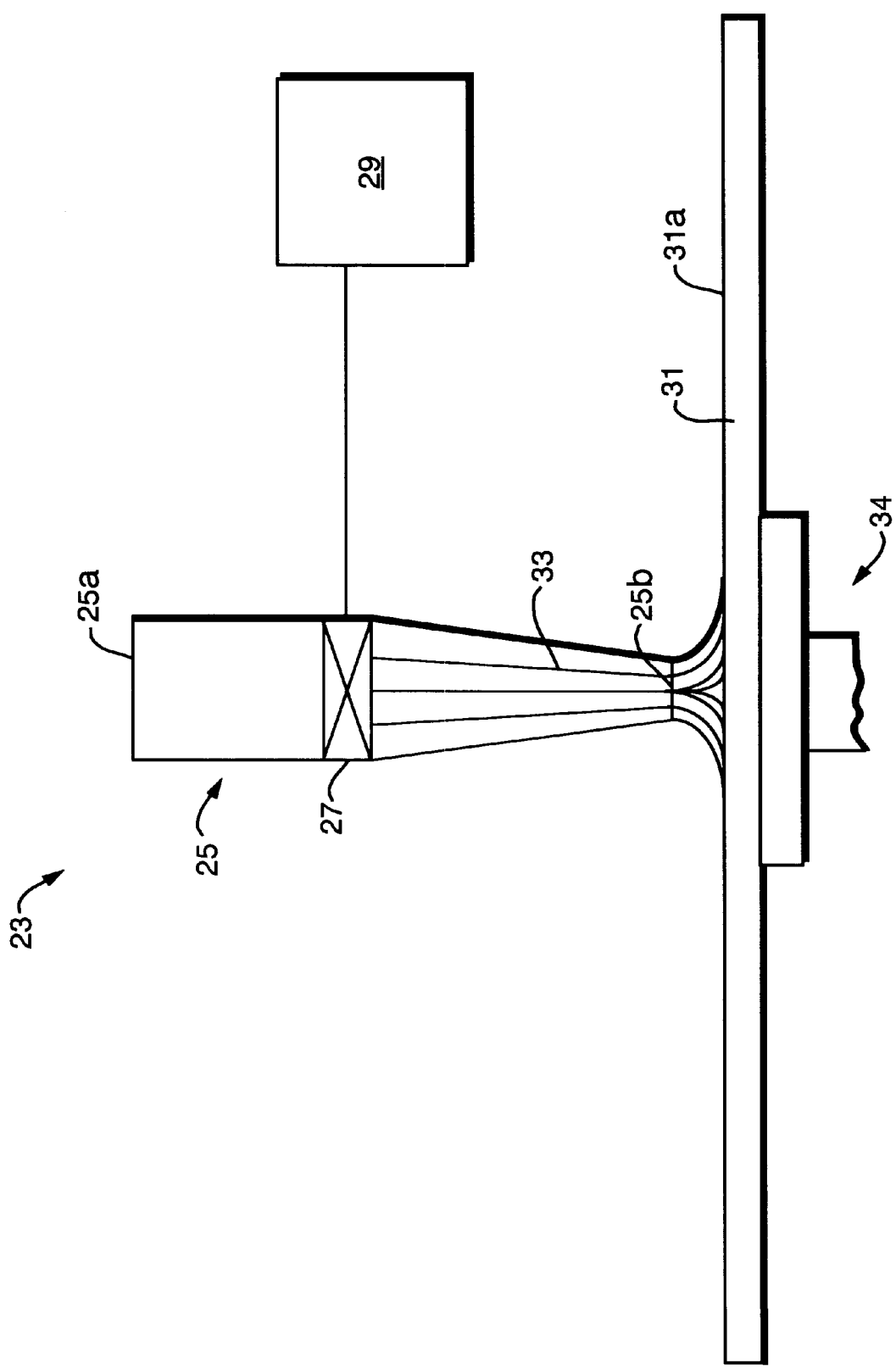
FIG. 2 is a schematic side elevational view of a conventional sonic nozzle cleaning device, as previously described.
Figure 3:
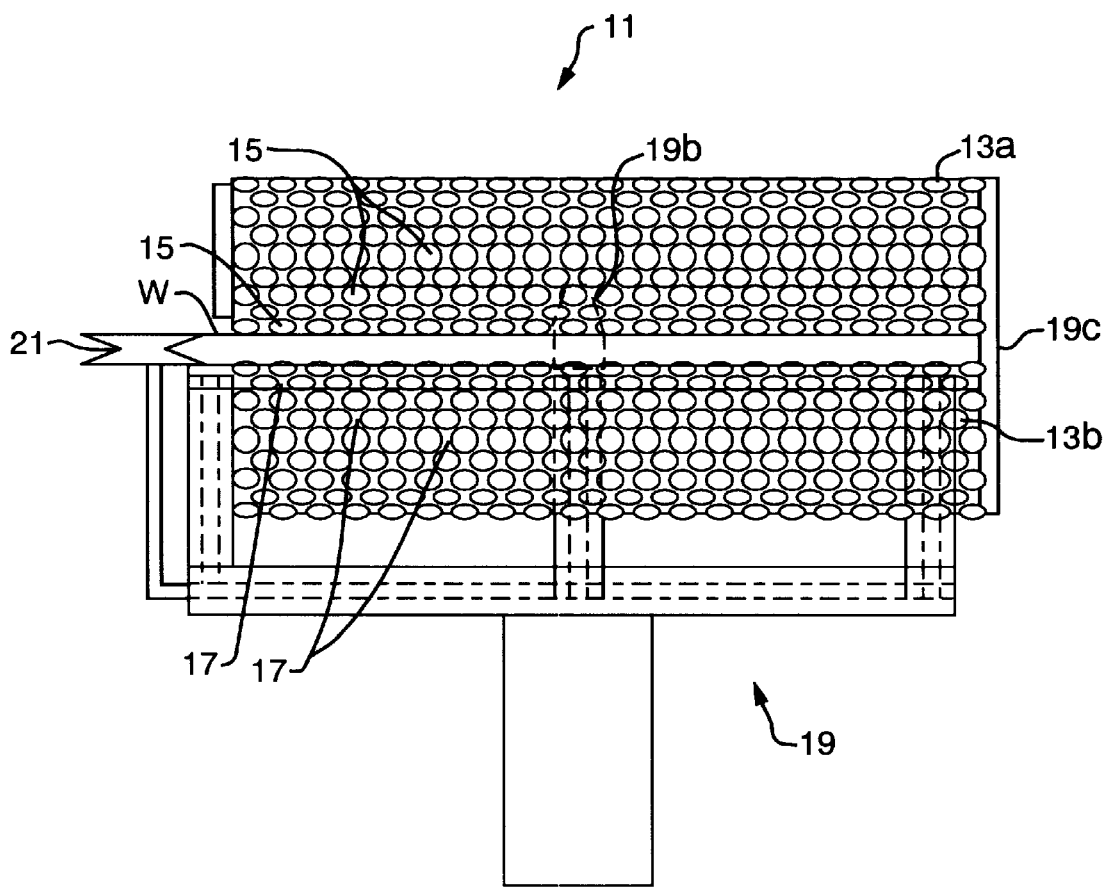
FIG. 3 is a schematic side elevational view of a conventional wafer scrubbing device which employs a conventional edge cleaner, as previously described.
Figure 6:
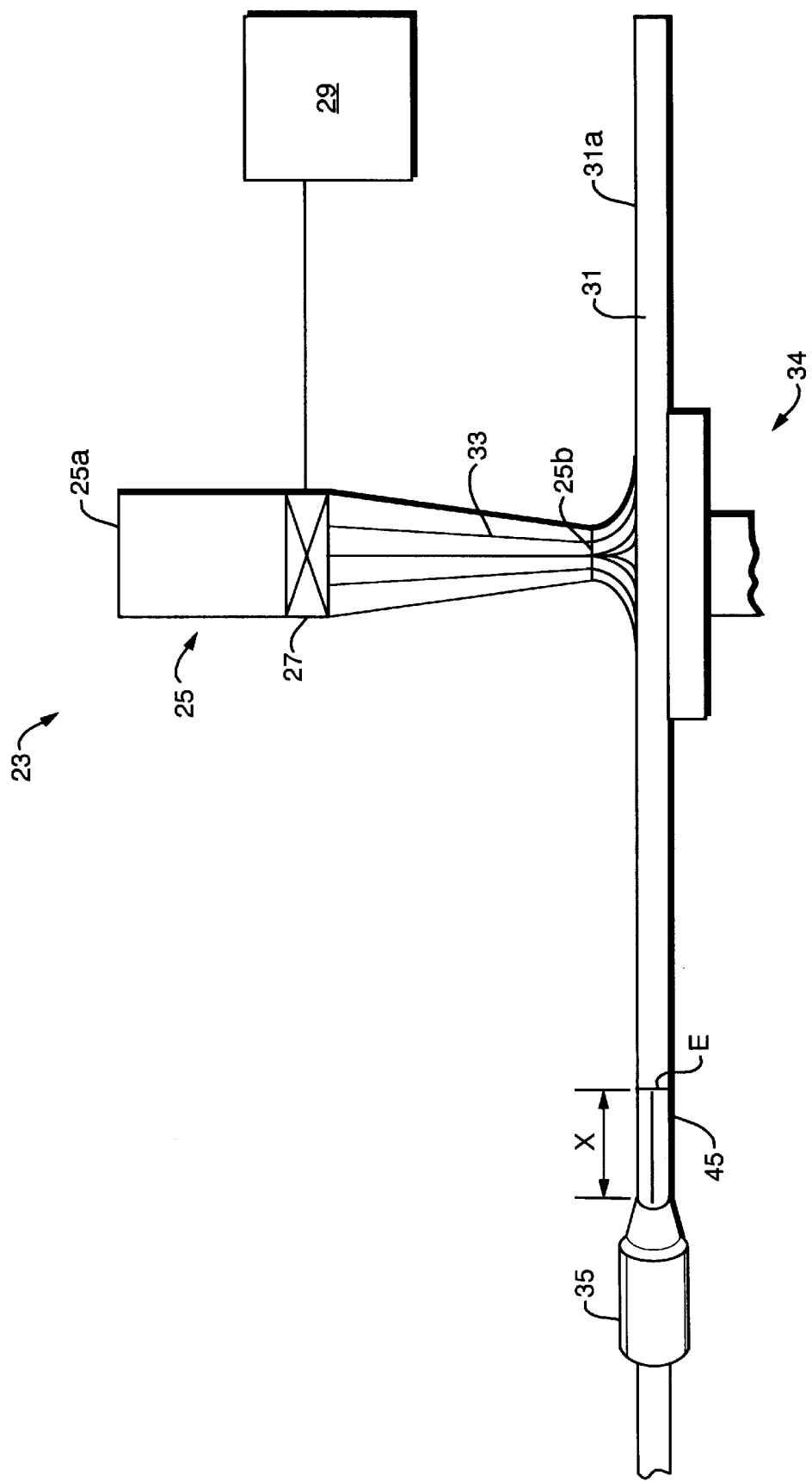
FIG. 6 is a side elevational view of the spin cleaner of FIG. 3 employing the inventive edge nozzle.

Because the inventive edge nozzle 35 preferably is radially spaced from the surface of the wafer W, the inventive nozzle may be used with any conventional surface cleaner, without obstructing the major surface cleaner's access to the wafer's major surfaces and without being obstructed from the wafer's edge surface by the major surface cleaning mechanism. In each embodiment of the invention, slurry residue and other particles are removed from a wafer's edge more economically and more reliably than previous methods, reducing the cost per wafer unit processed. FIG. 6 shows the inventive edge nozzle 35 employed with the conventional spin cleaner of FIG. 2, and FIG. 7 shows the inventive edge nozzle 35 employed with a megasonic tank cleaner such as that disclosed in U.S. patent Ser. No. 09/191,060 (AMAT No. 2431/CMP/RKK) titled IMPROVED MEGASONIC CLEANER, filed on even date herewith, the disclosure of which is incorporated herein by this reference.

With reference to FIG. 6, the nozzle 25 is shown cleaning the major surface 31a of the wafer 31. As previously described, to clean the entire major surface 31a, the nozzle 25 is scanned across the major surface 31a as the wafer 31 is rotated via the rotating mechanism 34. To affect edge cleaning in accordance with the present invention, the edge nozzle 35 preferably is positioned a distance x from the wafer 31 so that the liquid jet 45 strikes the edge E of the wafer 31 within the angle ranges previously described. Accordingly, as the wafer 31 is rotated by the rotating mechanism 34, the inventive edge nozzle 35 cleans slurry residue and other particles from the edge E of the wafer 31 simultaneous with the cleaning of the major surface 31a via the nozzle 25. The inventive edge cleaning method, therefore, takes advantage of the wafer rotation already required to clean the major surface 31a of the wafer 31, eliminating the need for additional rotating mechanisms.

With reference to FIG. 7, an inventive edge cleaner 63 is shown that comprises in pertinent part, a tank 65 for partially submerging the wafer W in a cleaning solution 65a, wafer support and rotating mechanisms 67a, 67b, sonic transducers 69a, 69b, an overflow weir 71, a pump 73 and a filter 75. The inventive edge nozzle 35 is operatively coupled to the wafer support and rotating mechanisms 67a, 67b so as to spray the liquid jet 45 at the unsubmerged edge of the wafer W as the wafer W is rotated. In operation, the sonic transducers 69a, 69b direct sonic energy in the form of longitudinal pressure waves toward the majors surfaces $W_1$, $W_2$ of the wafer. The longitudinal pressure waves strike the surfaces $W_1$, $W_2$ and remove slurry residue and other particles from the major surfaces $W_1$ and $W_2$. The removed slurry residue and particles flow into the overflow weir 71 and are filtered from the cleaning solution by the filter 75. The wafer W is rotated by the wafer support and rotating mechanisms 67a, 67b to clean the entire area of each major surface $W_1$, $W_2$. Simultaneous with the cleaning of the surfaces $W_1$, $W_2$, the nozzle 35 cleans the edge of the wafer W. In this configuration the major surfaces $W_1$, $W_2$ are cleaned using less cleaning fluid as the wafer W is only partially submerged, and as the inventive edge nozzle provides the fluid necessary to prevent drying of the wafer W, to clean the wafer's edge, and to add liquid to the tank 65 such that particles on the surface of the liquid are flushed into the overflow weir 71.

The foregoing description discloses only the preferred embodiments of the invention, modifications of the above disclosed apparatus and method which fall within the scope of the invention will be readily apparent to those of ordinary skill in the art. For instance, although the inventive edge nozzle preferably is radially spaced from the wafer's edge and is positioned such that the liquid jet is directed approximately parallel to the plane of the wafer, the invention includes other less preferred positions in which the liquid jet is not directed parallel to the plane of the wafer (e.g., perpendicular to the plane of the wafer, etc.) and/or in which the inventive edge nozzle overlaps a major surface of the wafer. The invention includes any nozzle that functions primarily to clean the edge of a thin disc (i.e., a dedicated edge nozzle), and includes any cleaning method that maintains a sonic nozzle positioned so that sonicated liquid output thereby is directed to strike an edge of the thin disc as the thin disc edge is scanned relative to the nozzle.

A plurality of edge nozzles (e.g., an additional edge nozzle 36 may be employed for edge cleaning, and one or more edge nozzles may provide sufficient force to rotate the thin disc during edge cleaning, thus eliminating the cost and complexity associated with motorized disc and/or nozzle rotation. Further, mechanisms other than those shown in the figures exist for cleaning a thin disc's major surfaces and many such mechanisms may be advantageously employed with the present invention to achieve simultaneous cleaning of both the edges and the major surfaces of a thin disc. The specific major surface cleaners shown and described are merely those preferred for use with the present invention. Further, as used herein, a substrate or a wafer includes, but is not limited to a semiconductor wafer with or without material layers thereon, whether patterned or unpatterned.

Accordingly, while the present invention has been disclosed in connection with the preferred embodiments thereof, it should be understood that other embodiments may fall within the spirit and scope of the invention, as defined by the following claims.

The invention claimed is:

1. An apparatus adapted to clean a thin disc comprising:
   a thin disc supporting location;
   a first sonic nozzle operatively coupled to the thin disc supporting location, so as to direct a jet of sonicated liquid at an edge of a thin disc positioned on the thin disc supporting location and so that the nozzle is radially spaced from the edge of the thin disk, and so that the liquid jet from the nozzle is approximately 30° to 150° from a tangent to the edge of the thin disk, and is approximately 135° to 225° from a major surface of the thin disk;
   a mechanism operatively coupled to the thin disc supporting location adapted to scan a thin disc edge relative to the sonic nozzle; and
   a cleaning mechanism operatively coupled to the thin disc supporting location adapted to clean a first major surface of the thin disc positioned on the thin disc supporting location.

2. The apparatus of claim 1 wherein the sonic nozzle is positioned so that the jet of sonicated liquid strikes the edge of the thin disc at an angle approximately between 45° and 135° from a tangent to the edge of the thin disc and at an angle approximately between 150° and 210° from the major surface of the thin disc.

3. The apparatus of claim 2 wherein the sonic nozzle is positioned so that the jet of sonicated liquid strikes the edge of the thin disc at an angle approximately between 45° and 135° from a tangent to the edge of the thin disc and at an angle approximately between 170° and 190° from the major surface of the thin disc.

4. The apparatus of claim 3 wherein the sonic nozzle is positioned so that the jet of sonicated liquid strikes the edge of the thin disc at an angle of approximately 45° from a tangent to the edge of the thin disc and at an angle of approximately 180° from the major surface of the thin disc.

5. The apparatus of claim 1 wherein the sonic nozzle is positioned a radial distance of approximately 1 mm to 50 mm from the edge of the thin disc.

6. The apparatus of claim 5 wherein the sonic nozzle is positioned a radial distance of approximately 7 mm to 20 mm from the edge of the thin disc.

7. The apparatus of claim 1 wherein the mechanism for scanning the thin disc edge comprises a rotating mechanism for causing the thin disc to rotate.

8. The apparatus of claim 1 wherein the mechanism for scanning the thin disc edge comprises a rotating mechanism for causing the nozzle to rotate around the thin disc.

9. The apparatus of claim 1 wherein the mechanism for scanning the thin disc edge comprises a rotatable platform, and wherein the jet of sonicated liquid from the first sonic nozzle provides sufficient force to rotate the rotatable platform.

10. The apparatus of claim 1 further comprising a second sonic nozzle operatively coupled to the thin disc supporting location, so as to direct a jet of sonicated liquid at an edge of a thin disc positioned on the thin disc supporting location and so that the nozzle is radially spaced from the edge of the thin disk, and so that the liquid jet from the nozzle is approximately 30° to 150° from a tangent to the edge of the thin disk, and is approximately 135° to 225° from a major surface of the thin disk.

11. The apparatus of claim 10 wherein the mechanism for scanning the thin disc edge comprises a rotatable platform, and wherein the jet of sonicated liquid from the first sonic nozzle and the jet of sonicated liquid from the second sonic nozzle provide sufficient force to rotate the rotatable platform.

12. The apparatus of claim 1 wherein the cleaning mechanism is adapted to clean a first major surface and a second major surface of a thin disc positioned on the thin disc supporting location.

13. The apparatus of claim 12 wherein the first sonic nozzle is positioned so as not to obstruct operation of the cleaning mechanism adapted to clean the first major surface and the second major surface of the thin disc positioned on the thin disc supporting location, thereby enabling simultaneous cleaning of the thin disc edge via the first sonic nozzle, and of the first major surface and the second major surface of the thin disc via the cleaning mechanism adapted to clean the first major surface and the second major surface of the thin disc positioned on the thin disc supporting location.

14. The apparatus of claim 12 wherein the cleaning mechanism comprises a first brush and a second brush adapted to clean the first major surface and the second major surface of the thin disc positioned on the thin disc supporting location, respectively.

15. The apparatus of claim 1 wherein the cleaning mechanism comprises a spin rinser.

16. The apparatus of claim 1 wherein the cleaning mechanism comprises a spin cleaner.

* * * * *